United States Patent [19]
Ozawa

[11] Patent Number: 5,452,787
[45] Date of Patent: Sep. 26, 1995

[54] PARTS TRANSFER APPARATUS

[75] Inventor: Kazushige Ozawa, Shizuoka, Japan

[73] Assignee: Tenryu Technics Co., Ltd., Shizuoka, Japan

[21] Appl. No.: 183,508

[22] Filed: Jan. 18, 1994

[30] Foreign Application Priority Data

Jan. 18, 1993 [JP] Japan .................... 5-005568

[51] Int. Cl.$^6$ .................................. B65G 29/00
[52] U.S. Cl. ...................... 198/468.4; 198/468.2
[58] Field of Search ................ 198/468.4, 468.01, 198/468.2, 468.6, 468.9, 345.1, 345.2

[56] References Cited

U.S. PATENT DOCUMENTS

| | | | |
|---|---|---|---|
| 1,887,211 | 11/1932 | Mortimer. | |
| 5,105,528 | 4/1992 | Suth et al. | 29/568 |
| 5,167,316 | 12/1992 | Kaminski | 198/468.4 |

FOREIGN PATENT DOCUMENTS

2532919  3/1984  France.

OTHER PUBLICATIONS

IBM Technical Disclosure Bulletin vol. 28, No. 1, 1 Jun. 1985.

*Primary Examiner*—James R. Bidwell

[57] ABSTRACT

Apparatus which transfers parts in a given direction by reciprocating a pair of parts transfer blocks, comprising: two parts transfer blocks (1) and (2); vertical guides (3) and (4) for allowing independent vertical movement of the transfer blocks, a guide (5) for the horizontal movement of transfer blocks (1) and (2); a power transmissions mechanism for reciprocating the transfer blocks (1) and (2) by use of a belt system; and a mechanism (7) for guiding the reciprocating motion of the transfer blocks (1) and (2). When a part (8) is sent out being drawn to and fixed to the vacuum pad (9) of the transfer block (1) and the empty vacuum pad (10) of the other transfer block (2) is returning to interlocking relation to the former transfer block (1), the transfer block (1) in which the part (8) is fixed and the empty transfer block (2) cross each other at different heights.

6 Claims, 5 Drawing Sheets

PRIOR ART

PRIOR ART

PRIOR ART

PARTS TRANSFER APPARATUS

BACKGROUND OF THE INVENTION

1. Field of the Invention

The present invention relates to a parts transfer apparatus, and more particularly, to a technique effectively applicable to a parts transfer apparatus which transfers parts such as electronic parts in a given direction by reciprocating a pair of parts transfer blocks, having reduced transfer time and small size.

2. Related Art Statement

As a parts transfer apparatus which transfers parts in a given direction, there is an apparatus which is used together with, for example, a chip mounter for mounting electronic parts such as a semiconductor device on a printed circuit board. At a loading position, electronic parts housed in a tray or the like are taken out one by one, and sucked and fixed by a vacuum pad of a transfer block, transferred through a transfer path to a given releasing position, and then, mounted on a printed circuit board by a chip mounter.

As shown in FIGS. 3(a) to 5(b), as the transfer apparatus of this kind, there are a rotational type (FIGS. 3(a) and 3(b)) in which a vacuum pad 22 is arranged on both ends of a rotary board 21 which is rotated by means of a motor and the like; a belt rotation type (FIGS. 4(a) and 4(b)) in which the vacuum pads 22 are installed on a belt 23 which is rotated by a motor and the like; and a guide type (FIGS. 5(a) and 5(b)) in which vacuum pads 22 are mounted respectively on guides 24 which are reciprocated by means of an air cylinder and the like.

However, each of these conventional techniques requires large area for installation and movement of a transfer apparatus.

Particularly, in the case of the rotational type, an area larger than covered by rotation of the diameter of the transfer path is necessary. Thus, there has been a desire for improvement of the apparatus to make it small.

Also, in the case of the guide type having reciprocated movement by air cylinders and the like, because the apparatus has two guides for the transfer blocks, it is impossible to set the same loading and releasing points for two transfer blocks transferring a part on their vacuum pads. Therefore, this type is not suitable, in particular, for succesive transfer, and the apparatus can not be adapted for shorter transfer time and larger transfer capacity.

SUMMARY OF THE INVENTION

It is an object of the present invention to provide a technique in a parts transfer apparatus for transferring parts in a given direction by reciprocative movement of parts transfer blocks, which is capable of reducing transfer time and obtaining a small-sized apparatus.

Among the inventions to be disclosed herein, the outlines of typical ones will be described as follows.

According to the present invention, a parts transfer apparatus, which transfers parts in a given direction by reciprocative movements of first and second parts transfer blocks, is provided with a guiding mechanism for making the first and second transfer blocks cross each other at different heights when one of the first and second parts transfer blocks is sent out with a part mounted thereon while the other parts transfer block is returned empty in interlocked relation to the former parts transfer block.

The guiding mechanism comprises: a track guide of generally concave configuration whose both ends are formed in a given slope; and a seesaw guide which has a fulcrum arranged substantially on the center line of the generally concave configuration of the track guide and touches alternatively both ends of the generally concave configuration.

The first and second parts transfer blocks are held in a vertically movable manner to a belt which is reciprocated by a rotational system.

Further, a first parts vacuum fixing member and a second parts vacuum fixing member, each of which sucks a part through vacuum or reduced pressure, are fixed to first and second parts transfer blocks respectively.

According to the parts transfer apparatus of the present invention, the first parts transfer block and the second parts transfer block cross each other at different heights through the mechanisms of the track guide and the seesaw guide, while being held vertically movable to the belt which is in a reciprocating motion. Therefore, for example, when the first vacuum fixing member of the first parts transfer block sucks and fixes a part, it is possible to move the first parts transfer block along the seesaw guide, while the second parts transfer block with empty second parts vacuum fixing member moves along the track guide so that it passes underneath the first parts vacuum fixing member which fixes the part.

Thereby, the installation location of the transfer apparatus and the occupied area for movement of the transfer apparatus can be reduced. Moreover, it becomes possible to set the loading and releasing points of the parts at the same position, hence reducing the transfer time and the enhancement of the transfer capacity can be attained.

Particularly, when the first parts vacuum fixing member and the second parts vacuum fixing member are fixed to the first and second parts transfer blocks respectively, parts can be stably transferred being fixed by suction force.

BRIEF DESCRIPTION OF THE DRAWINGS

The above-mentioned and other objects, new features and advantages of the present invention will become more apparent by referring to the following detailed description of an embodiment according to the invention in conjunction with the accompanying drawings, in which.

DETAILED DESCRIPTION OF THE PREFERRED EMBODIMENTS

Figure 1:
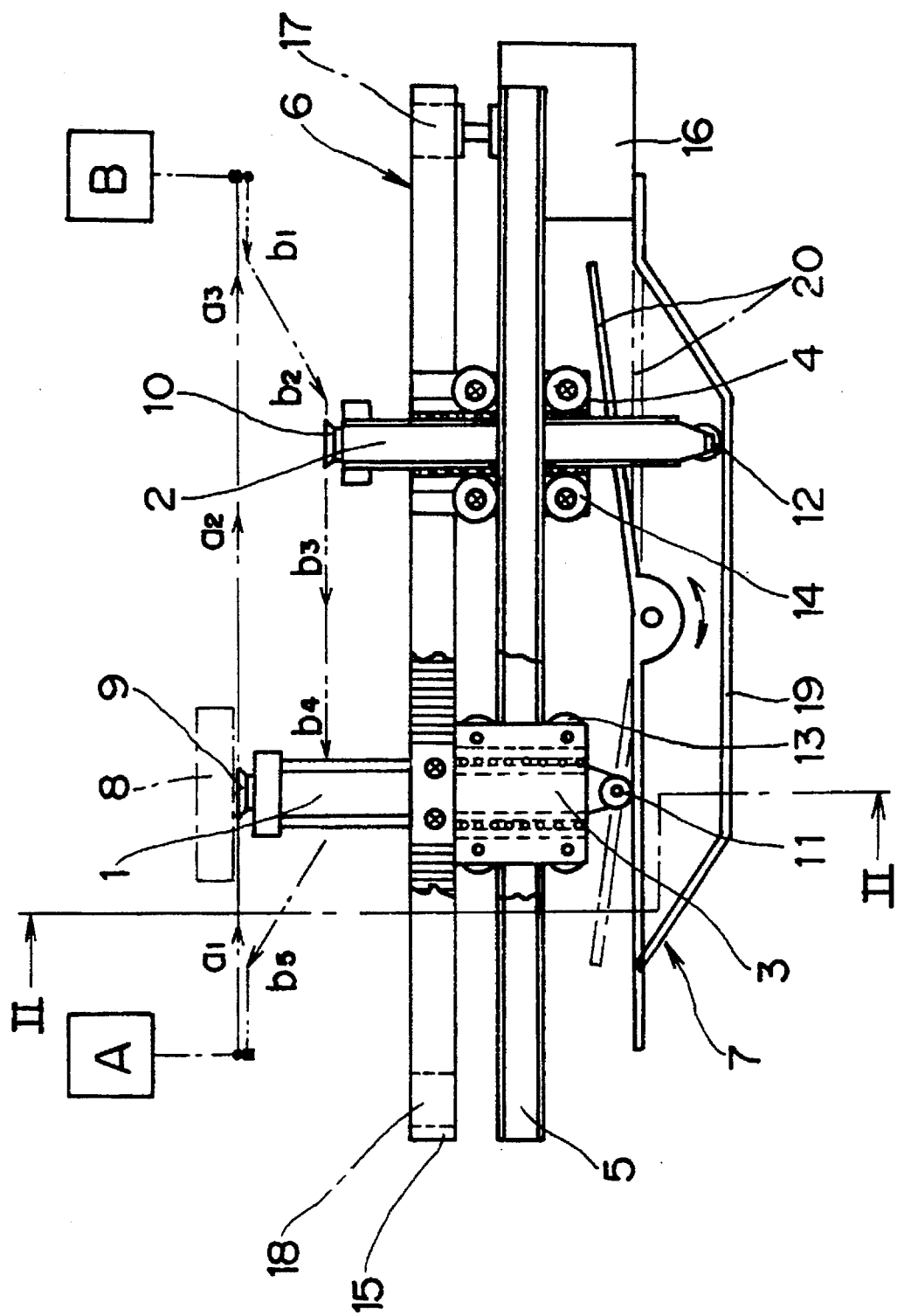
FIG. 1 is a front view showing a principal part of a parts transfer apparatus according to an embodiment of the present invention.

At first, referring to FIG. 1 and FIG. 2, the principal structure of a parts transfer apparatus according to an embodiment of the present invention will be explained.

The parts transfer apparatus of the present embodiment is a parts transfer apparatus which transfers parts in a given direction by allowing a pair of parts transfer blocks reciprocate, for example, and comprises;

two transfer blocks, a first parts transfer block 1 and a second parts transfer block 2, each of which has a generally reversed L-shape and carries a part;

vertical guides 3 and 4 which enable independent vertical movements of the transfer blocks 1 and 2 respectively;

a horizontal guide 5 which enables the transfer blocks 1 and 2 to move horizontally;

a power transmission mechanism 6 which allows the transfer blocks 1 and 2 to reciprocate by belt system; and a guiding mechanism 7 which guides the reciprocating motion of the transfer blocks 1 and 2.

Further, the apparatus of the present invention is constructed so that, when a part 8, for example an electronic part such as a semiconductor device, is loaded on one transfer block, for example the transfer blocks 1, and sent out, and the other transfer block 2 is returned in empty state in interlocking relation to the former transfer block 1, the transfer block 1 on which the part 8 is loaded and the empty parts transfer block 2 cross each other at different heights, and the empty transfer block 2 is allowed to pass underneath the part 8 loaded on the transfer block 1.

On upper ends of the transfer blocks 1 and 2, vacuum pads 9 and 10 as first parts vacuum fixing member 9 and second parts vacuum fixing member 10 are fixed respectively, and on lower ends, track rollers 11 and 12 are rotatively mounted respectively. And, the transfer blocks 1 and 2 are held in vertically movable manner by the vertical guides 3 and 4 respectively, distance of the vertical movement of the transfer blocks being decided along the reciprocative track of the guiding mechanism 7, and the horizontal movement being guided by the horizontal guide 5 through the rotation of the rollers 13 and 14 of the respective vertical guides 3 and 4.

The power transmission mechanism 6 comprises a toothed belt 15, a pulse motor 16, and pulleys 17 and 18, the toothed belt 15 being extended between the pulley 17 fixed to the rotational shaft of the pulse motor 16 and the pulley 18 which is rotatably fixed. The transfer blocks 1 and 2 which are held in vertically movable manner to the toothed belt 15 at positions symmetrical with respect to the center of the rotation of the belt 15, and are allowed to reciprocate in a given sequence in interlocking relation to the rotational control of the pulse motor 16.

The guiding mechanism 7 comprises: a track guide 19 which is of generally concave configuration and whose both ends are formed in a given slope; and a seesaw guide 20 which has a fulcrum positioned substantially in the center line of the generally concave configuration of the track guide 19 and contacts alternatively both ends of the generally concave configuration. The seesaw guide 20 is made automatically return to the side of sending out the part 8 due to a given pulling force, for example, by a coil spring.

For example, when the part 8 is sucked and fixed, for example, by the vacuum pad 9 of the transfer block 1, this transfer block 1 is sent out with the track roller 11 being rotated along the seesaw guide 20, and at the same time, the transfer block 2 of the empty vacuum pad 10 is returned back along the-track guide 19.

Next, the operation of the present embodiment for transferring a part 8 is explained with reference to FIG. 1.

Figure 2:
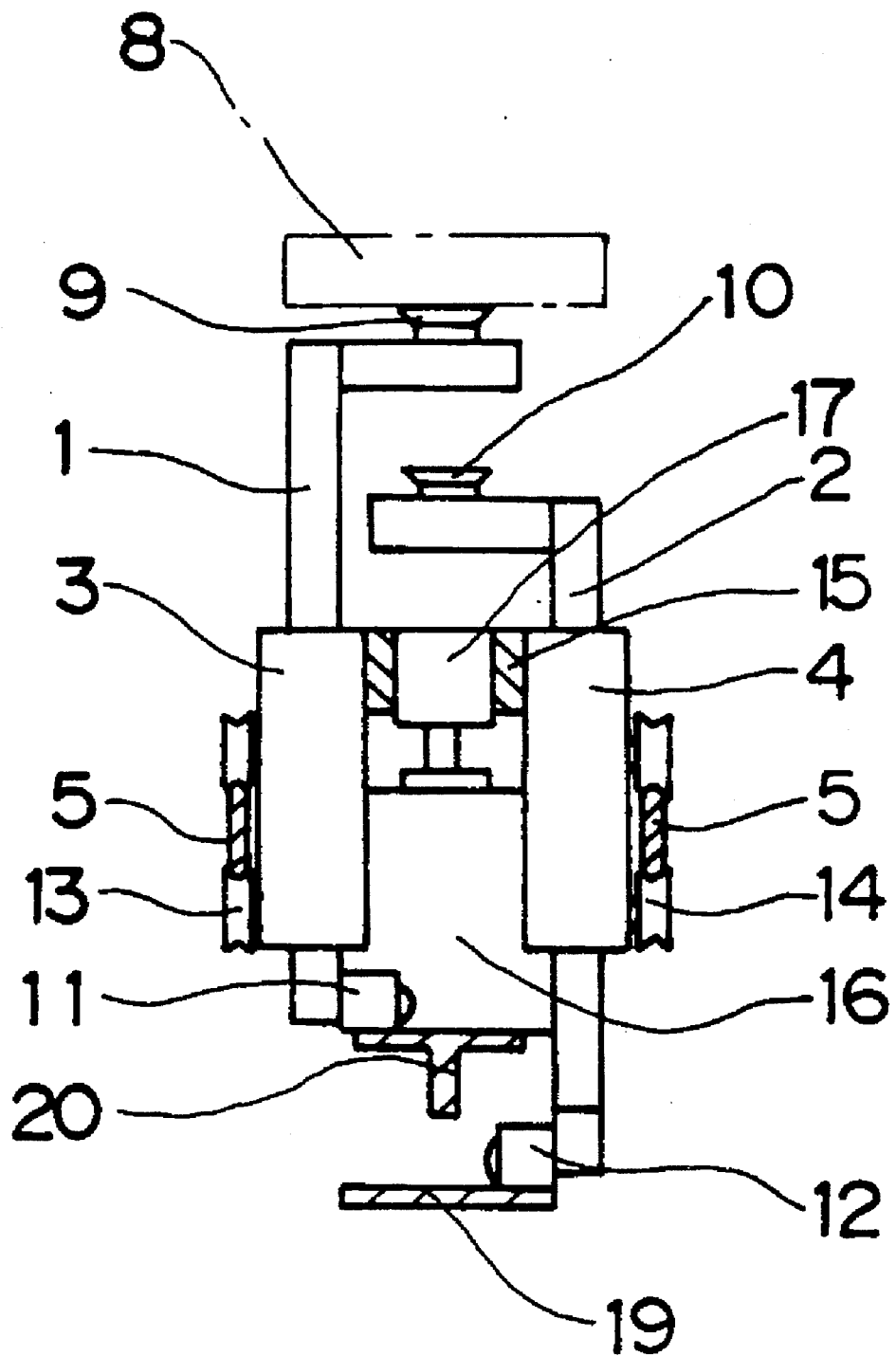
FIG. 2 is a cross-sectional view of the embodiment taken along line II—II in FIG. 1.
Figure 3A:
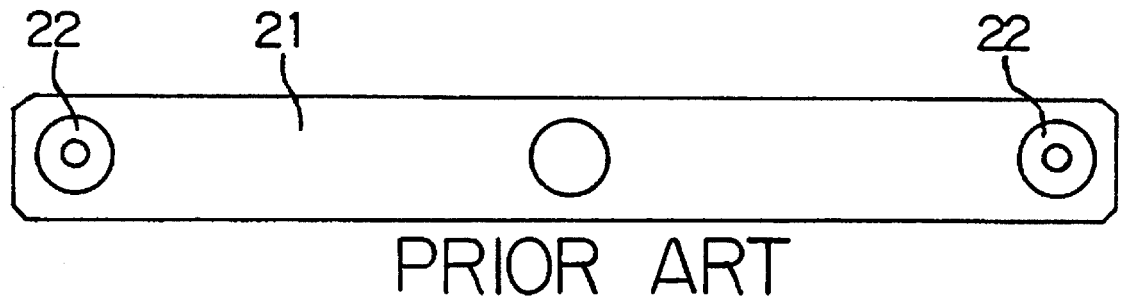
FIGS. 3(a) and 3(b) are a plan view and a side view showing a principal part of a parts transfer apparatus according to an example of the conventional technique.
Figure 3B:
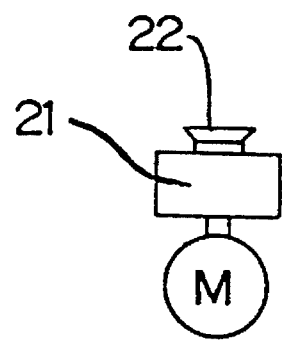
Figure 4A:
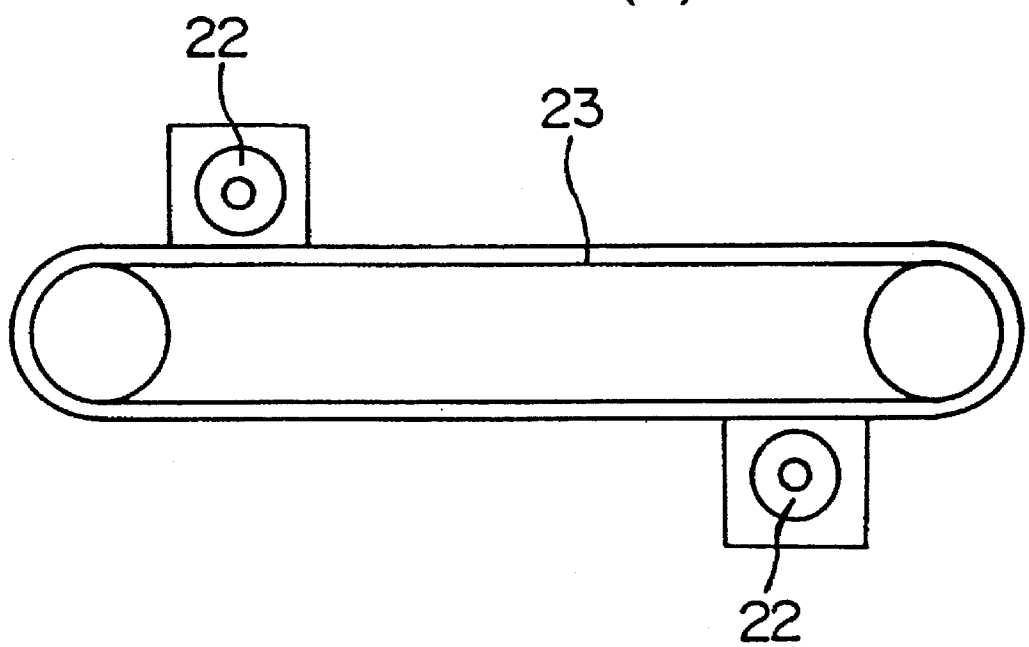
FIGS. 4(a) and 4(b) are a plan view and a side view showing a principal part of a parts transfer apparatus according to another example of the conventional technique.
Figure 4B:
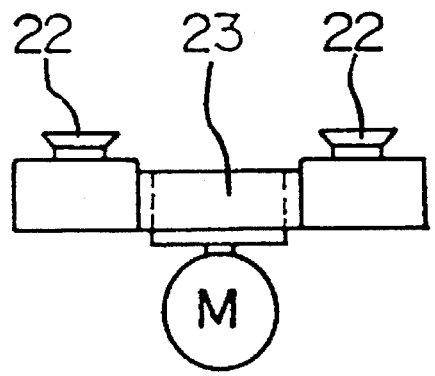
Figure 5A:
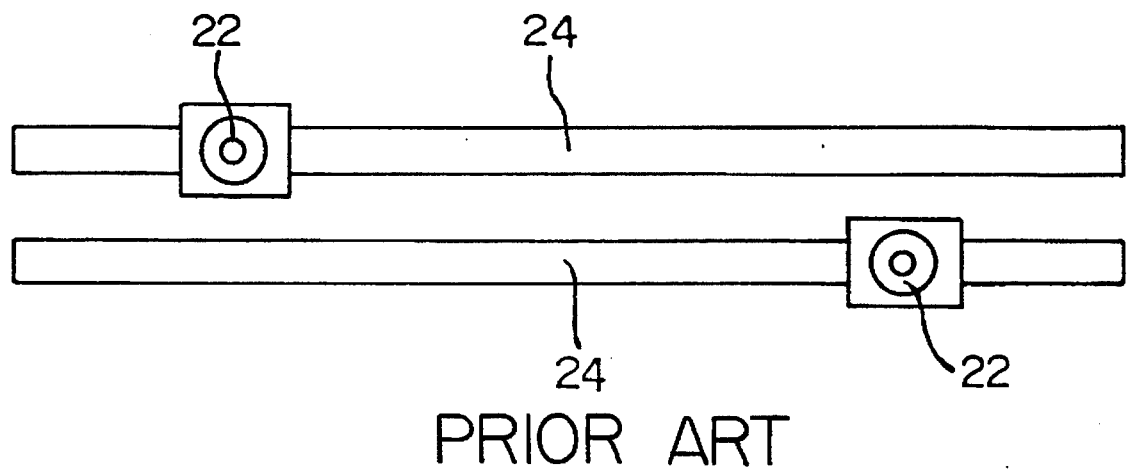
FIGS. 5(a) and 5(b) are a plan view and a side view showing a principal part of a parts transfer apparatus according to still another example of the conventional technique.
Figure 5B:
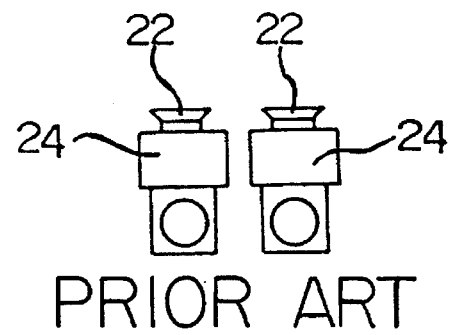

In this case, it is assumed that the points A and B in FIG. 1 are respectively a loading point and a releasing point of the part 8, and that the part 8 is transferred in the direction from the point A to the point B. Also, it is assumed that the present transfer apparatus is used together with a chip mounter which is employed for mounting electronic parts such as semiconductor devices on a printed circuit board, for example.

At first, the part 8 is loaded on the vacuum pad 9 of the transfer blocks 1 for example, and the transfer block 1 is moved in the horizontal direction. The part 8 is loaded on the vacuum pad 9, departs from the point A, and passes through the tracks a1, a2, and a3 with the track roller 11 of the transfer block 1 rotating along the seesaw guide 20 which has been automatically returned to the position contacting the side of the point A. When the track roller 11 passes the fulcrum, the seesaw guide 20 becomes in the state contacting the side of the point B and the part 8 reaches to the point B.

Further, at the point B, the part 8 is released from the vacuum pad 9 of the transfer block 1 and the transfer block 1 is returned. At that time, the empty vacuum pad 9, departs from the point B, passes through the tracks of b1, b2, b3, b4, and b5, not along the seesaw guide 20 which is automatically returned to the initial position with the side of the point B being open, but along the track guide 19 of generally concave configuration. After passing the fulcrum, the empty vacuum pad 9 passes the open portion of the seesaw guide 20 which has now been in the state contacting the side of the point B again, and it arrives at the point A. Thus, the empty pad 9 moves in the vertical directions combined with the horizontal movement.

At the same time, the other transfer block 2 moves in interlocking relation to the transfer block 1. While the transfer block 1 moves from the point A to the point B, the transfer block 2 moves from the point B to the point A, and while the transfer block 1 moves from the point B to the point A, the transfer block 2 from the point A to the point B. Thus, the transfer block 2 follows the same track as the transfer block 1.

In that case, the empty vacuum pad 10 travels along the recess portion of the track guide 19, while the vacuum pad 9 loaded with the parts 8 travels along the seesaw guide 20. Thus, an empty vacuum pad crosses a loaded vacuum pad so that the empty vacuum pad always passes underneath a part loaded on the vacuum pad.

In this way, a series of reciprocating motion from the loading of a part 8 to the discharging thereof is repeated by the rotation control of the pulse motor 16 in a given sequence.

Therefore, according to the parts transfer apparatus of the present embodiment, which comprises: the two vertically movable transfer blocks 1 and 2 to which the vacuum pads 9 and 10 are fixed respectively for sucking and fixing a part 8; and a guiding mechanism 7 comprising a track guide 19 of a generally concave configuration and a seesaw guide 20, it is possible that a transfer block 1 sucked and fixed a part 8 and an empty transfer block 2 cross at different heights, and the empty transfer block 2 passes underneath the transfer block 1 fixing the parts 8. Therefore, comparing to the conventional rotational type, belt rotation type and guide type, the installation area and the movement area of the transfer apparatus can be reduced.

As compared to the conventional guide type, in the transfer apparatus of the present embodiment, the loading and releasing points for parts 8 are the same for the two transfer blocks 1 and 2, and therefore, it is advantageous for successive transfer of parts, and, in particular, it results in the reduction of the transfer time and increase of the transfer capacity more than double.

Further, since the present embodiment of the invention adopts suction and fixing system using of the vacuum pads 9 and 10, the pressure exerting to a part 8 is small, and, in addition, because the adjustment of the speed can be easily effectuated by the driving of the pulse motor 16, the parts 8 can be transferred smoothly and a positional change of the part 8 while in transfer can be reduced.

Further, with respect to loading and releasing of the parts 8, positioning is possible in a wider area because the parts moves linearly between the loading and releasing points, and, in addition, driving of the apparatus is smoothly adjusted by use of the pulse motor 16.

As set forth above, the invention by the applicant has been described concretely on the basis of the embodiment. The present invention, however, is not restricted to the above embodiment, and it is needless to say that various modifications are possible within a scope of the present invention.

For example, regarding the parts transfer apparatus of the present embodiment, the description has been made of the case where the vacuum pads 9 and 10 are fixed to the transfer blocks 1 and 2, respectively. The present invention, however, is not limited to this, and it is also widely applicable, for example, to one having a holding mechanism which holds a side or an upper surface of a part, to the case where a part is transferred by simply loading it on a transfer block without being fixed, and the like.

Also, in the present embodiment, the description has been made of the case where the parts transfer apparatus is used in interlocking relation to a chip mounter or the like. The present invention, however, is widely applicable, of course, to other apparatuses in which transfer of parts in a small space is particularly required.

In the above descriptions, the explanation has been made regarding the case where the present invention is applied mainly to a parts transfer apparatus for electronic parts such as semi-conductor devices. The present invention is not limited thereto, and it is widely applicable to other electronic parts and whole kinds of parts which are able to be sucked and fixed.

Among the inventions disclosed herein, the effects of the typical ones will be described briefly as follows:

1) It is possible to narrow the width range needed for movement of the apparatus by providing a guiding mechanism which comprises a track guide and a seesaw guide which enable first and second parts transfer blocks to cross each other at different heights, because, when, for example, the first parts transfer block is sent out with a part loaded thereon and the second parts transfer block is returned empty in interlocking relation to the first parts transfer block, the first transfer block travels along the seesaw guide, and the empty second parts transfer block travels along the track guide so that the latter passes underneath the part loaded on the first parts transfer block.

2) To the first and second parts transfer blocks, first and second vacuum fixing members which suck a part in vacuum or reduced pressure condition are fixed respectively, and transfer of the part is stabilized because the part is sucked and fixed.

3) According to the above item (1), the area for installation and movement of the parts transfer apparatus is reduced, and the small-sized apparatus is obtained.

4) According to the above item (1), successive transfer is possible because the loading and releasing points for parts are same for both transfer blocks, and, further, it is possible to reduce the transfer time and to improve the transfer capacity.

5) According to the above item (1), operating speed can be adjusted easily and smooth transfer is possible, for example, by pulse motor driving, and therefore wider positioning range can be obtained along the transfer line.

6) According to items (1) to (5), it is possible to obtain a small-sized parts transfer apparatus in which transfer time is reduced because of succesive stabilized transfer of parts.

What is claimed is:

1. A parts transfer apparatus for transferring parts in a given direction by reciprocating a first parts transfer block and a second parts transfer block, comprising a guiding mechanism which guides said first parts transfer block and said second parts transfer block to cross each other at different heights when one of the first parts transfer block and the second parts transfer block is sent out with a part loaded thereon and the other parts transfer block is returned back empty to the transfer block loaded with the part, the guiding mechanism including a track guide having generally concave configuration, both ends of which are formed in a given slope, and a seesaw guide which has a fulcrum substantially on the center line of the generally concave configuration of the track guide and contacting alternately ends of the track guide, the transfer block loaded with the part thereon moving along said seesaw guide, and the empty transfer block moving along said track guide so that the latter transfer block passes underneath the parts loaded on the former transfer block.

2. The parts transfer apparatus according to claim 12, wherein: said first and second parts transfer blocks are held in a vertically movable manner to a belt which is reciprocated by a rotational system.

3. The parts transfer apparatus according to claim 2, wherein: a first vacuum fixing member and a second vacuum fixing member which suck the part in a reduced pressure state are fixed to the first and second parts transfer blocks respectively, and the part is transferred in a sucked and fixed state.

4. The parts transfer apparatus according to claim 2, wherein: said belt constitutes a power transmission mechanism for making the first parts transfer block and the second parts transfer block reciprocate.

5. The parts transfer apparatus according to claim 4, wherein: said power transmission mechanism comprises a pulse motor, a pulley fixed to the rotational shaft of said pulse motor, another rotatable pulley, and said belt extended between said two pulleys.

6. The parts transfer apparatus according to claim 5, wherein: a series of reciprocating motions from loading to discharging of said part is repeated by the rotation control of the pulse motor in a given sequence.

* * * * *

UNITED STATES PATENT AND TRADEMARK OFFICE
CERTIFICATE OF CORRECTION

PATENT NO. : 5,452,787
DATED : September 26, 1995
INVENTOR(S) : Kazuhige Ozawa

It is certified that error appears in the above-indentified patent and that said Letters Patent is hereby corrected as shown below:

Column 6, line 37, delete "12" and substitute -- 1 --.

Signed and Sealed this

Thirteenth Day of February, 1996

Attest:

BRUCE LEHMAN

Attesting Officer    Commissioner of Patents and Trademarks